United States Patent
Yang et al.

(10) Patent No.: US 7,732,922 B2
(45) Date of Patent: Jun. 8, 2010

(54) SIMULTANEOUS GRAIN MODULATION FOR BEOL APPLICATIONS

(75) Inventors: Chih-Chao Yang, Glenmont, NY (US); Louis C. Hsu, Fishkill, NY (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 11/970,149

(22) Filed: Jan. 7, 2008

(65) Prior Publication Data

US 2009/0174075 A1    Jul. 9, 2009

(51) Int. Cl.
 *H01L 29/40* (2006.01)
(52) U.S. Cl. .............. 257/751; 257/E21.575; 257/E21.627; 257/E21.641
(58) Field of Classification Search ............ 257/751, 257/E23.169–E23.178, E21.575–E21.597, 257/E21.627, E21.641
See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,030,895 A | 2/2000 | Joshi et al. | |
| 6,285,082 B1 | 9/2001 | Joshi et al. | |
| 6,287,954 B1 * | 9/2001 | Ashley et al. | 438/622 |
| 6,335,569 B1 | 1/2002 | Joshi | |
| 6,355,153 B1 * | 3/2002 | Uzoh et al. | 205/87 |
| 6,383,920 B1 | 5/2002 | Wang et al. | |
| 6,429,519 B1 | 8/2002 | Uzoh | |
| 6,943,105 B2 | 9/2005 | Joshi | |
| 2005/0085066 A1 * | 4/2005 | Tsao et al. | 438/633 |
| 2008/0296768 A1 * | 12/2008 | Chebiam et al. | 257/751 |

* cited by examiner

*Primary Examiner*—Wai-Sing Louie
*Assistant Examiner*—Bilkis Jahan
(74) *Attorney, Agent, or Firm*—Lisa U. Jaklitsch; Katherine S. Brown

(57) ABSTRACT

The invention is directed to an improved semiconductor structure, such that within the same insulating layer, Cu interconnects embedded within the same insulating level layer have a different Cu grain size than other Cu interconnects embedded within the same insulating level layer.

8 Claims, 6 Drawing Sheets

SIMULTANEOUS GRAIN MODULATION FOR BEOL APPLICATIONS

BACKGROUND OF THE INVENTION

1. Field of the Invention

The invention relates generally to a semiconductor structure, and more particularly to copper (Cu) interconnects embedded in the same insulating level layer with different copper grain sizes.

2. Description of the Related Art

One problem encountered in semiconductor manufacturing is the manufacture of copper (Cu) interconnects within the same insulating level layer with different Cu grain sizes. Currently, Cu interconnects formed within the same insulating level layer comprise the same Cu grain size. The limitation of a single Cu grain size for interconnects embedded within the same insulating layer is problematic because, for certain applications Cu interconnects perform more advantageously with a smaller Cu grain size, while for other applications Cu interconnects perform more advantageously with a larger Cu grain size. For example, a large Cu grain size results in lower electrical resistivity and longer electromigration lifetime, which is preferred for a high performance related application, while a small Cu grain size results in higher electrical resistivity and shorter electromigration lifetime, which is preferred for electrical-fuse related applications.

With current semiconductor manufacturing techniques to acquire Cu interconnects with Cu grain size optimized for a chosen application, multiple layers of Cu interconnects embedded within an insulating level layer must be created. Each insulating level layer will have embedded Cu interconnects with the same Cu grain size. Creation of a new layer of Cu interconnects to obtain Cu interconnects with different Cu grain sizes doubles the semiconductor processing steps. In addition, creation of a new layer of Cu interconnects with a different Cu grain size, doubles manufacturing costs.

As discussed herein above, a small Cu grain sized Cu interconnect is preferred for electrical-fuse (e-fuse) related applications. Electrically blowable fuses take advantage of the electromigration (EM) effect to open an electrical connection. During programming, voids form at a center fuse element due to high current density, and eventually create an electrically open circuit. It is also known that Cu grain size has a certain level of impact on electromigration resistance. In general, a larger Cu grain size (i.e.: closer to bamboo-type grain microstructure) leads to fewer grain boundaries that have components normal to the electron flow, and a smaller Cu grain size results in lower EM resistance because of more Cu diffusion through the grain boundaries. For e-fuse programming efficiency, a small Cu grain interconnect is ideal.

Further, as discussed herein above, a large grain sized Cu interconnect is preferred for a high performance applications. Large Cu grain size results in a Cu interconnect with lower resistivity. Big Cu grain size results in lower resistivity because there are fewer grain boundaries with a larger Cu grain size (i.e.: closer to bamboo-type grain microstructure). Grain boundaries cause electron scattering. Therefore, fewer grain boundaries results in less electron scattering, which in turn, results in less resistivity and higher conductivity. For better circuit performance with higher conductivity, a Cu interconnect with a large Cu grains is preferred.

FIG. 1 depicts prior art Cu interconnects 100a, 100b embedded in the same insulating level layer 12 with the same Cu grain size. Note that FIG. 1 depicts parallel pairs of single 10 and dual damascene 20 structures at the same insulating level layer 12. Both the single 10 and dual damascene 20 structures comprise a barrier material 14, copper seed 24, and electroplated copper 26b. Note that the electroplated copper structures 26b in 100a and 100b have the same small Cu grain size, which is evident by virtue of the multiple grain boundaries in the electroplated copper 26b depicted in FIG. 1. Therefore, as discussed herein above, the Cu interconnects 100a, 100b depicted in FIG. 1 would be ideal for an e-fuse application.

What is needed in the art are Cu interconnects embedded in the same insulating level layer with divergent Cu grain sizes, such that the Cu grain size for a given Cu interconnect enables such Cu interconnect to most efficiently perform for an intended application for such Cu interconnect without the need for duplicative semiconductor processing steps and associated costs.

BRIEF SUMMARY OF THE INVENTION

The invention is directed to a structure and method for creation of Cu interconnects embedded in the same insulating layer level with different Cu grain sizes.

A first embodiment is directed to a semiconductor structure comprising a first and second opening, a barrier material, a copper grain promotion material, a copper seed, and electroplated copper. The first and second opening are within the same insulating layer. A barrier material is deposited on the insulating layer in the first and second opening. A copper grain promotion material is deposited on the barrier material of the first opening. A copper seed is deposited on the copper grain promotion material of the first opening and on the barrier material of the second opening. Copper is electroplated on the copper seed within the first and second openings. The copper grain promotion material increases grain size of the electroplated copper in the first opening, such that an average grain size of the electroplated copper grown in the first opening is larger than an average grain size of the electroplated copper in the second opening. The first and second opening are within the same insulating level layer.

A second embodiment is directed to a method for a creating a semiconductor structure, comprising a creating, three depositing and an electroplating copper step. The creating step comprises creating a first and second opening within the same insulating layer. A depositing step comprises conformally depositing a barrier material in the first and second opening. A depositing step comprises depositing a copper grain promotion material on the barrier material of the first opening. A depositing step comprises depositing a copper seed on the copper grain promotion material of their first opening and on the barrier material of the second opening. The electroplating step comprises electroplating copper on the copper seed within both the first and second opening. The deposition of the copper grain promotion material of the first opening causes an average grain size of the electroplated copper in the first opening to be larger than an average grain size of the electroplated copper in the second opening. The first and second opening are within the same insulating level layer.

The invention solves the aforementioned problems associated with Cu interconnects embedded within the same insulating layer level. More specifically, the invention enables the creation of Cu interconnects embedded within the same insulating layer level with divergent Cu grain sizes. In so doing, the present invention enables the creation of Cu interconnects embedded within the same insulating layer level that perform most efficiently for the intended application of the Cu interconnect. In addition, semiconductor manufacturing processing steps are reduced in half because multiple insulating layer levels are not required to create Cu interconnects with different Cu grain sizes. Finally, the elimination of unnecessary processing steps reduces semiconductor manufacturing costs by at least fifty percent.

For at least the foregoing reasons, the invention improves semiconductor technology.

BRIEF DESCRIPTION OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION OF THE INVENTION

The invention will now be described with reference to the accompanying figures. In the figures, various aspects of the structures have been depicted and schematically represented in a simplified manner to more clearly describe and illustrate the invention.

By way of overview and introduction, the embodiments of the invention are directed to a Cu interconnect and a method for creating the same. The invention enables a Cu interconnect embedded within the same insulating layer level to have a different Cu grain size than another Cu interconnect embedded within the same insulating layer level.

The invention will be described with reference to the FIGS. 2-6, which depict the formation of an improved semiconductor structure.

Figure 1:
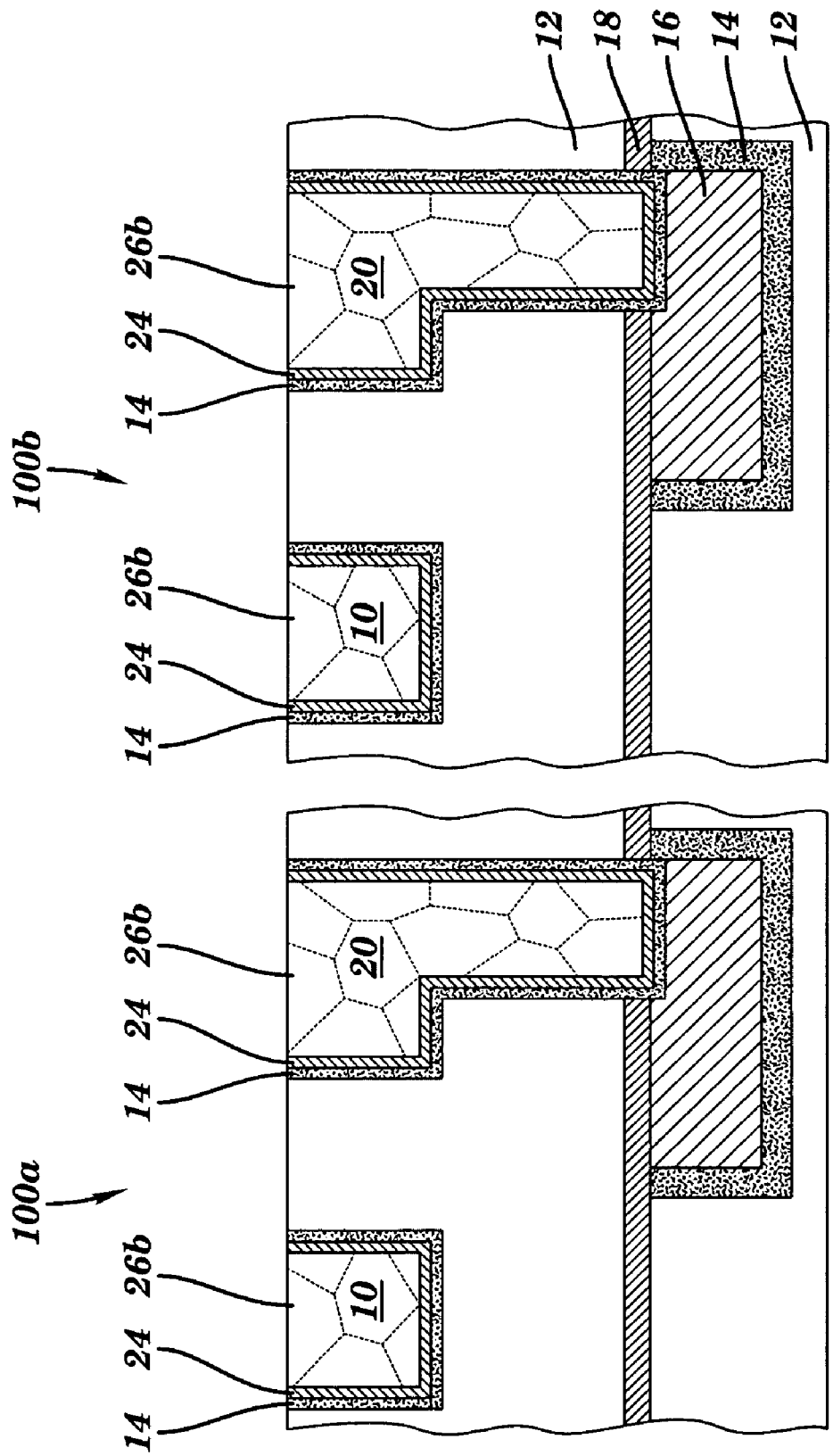
FIG. 1 depicts a prior art semiconductor structure embedded within the same insulating level layer; and, FIG. 2-6 depict the process for creation of the preferred embodiment.
Figure 2:
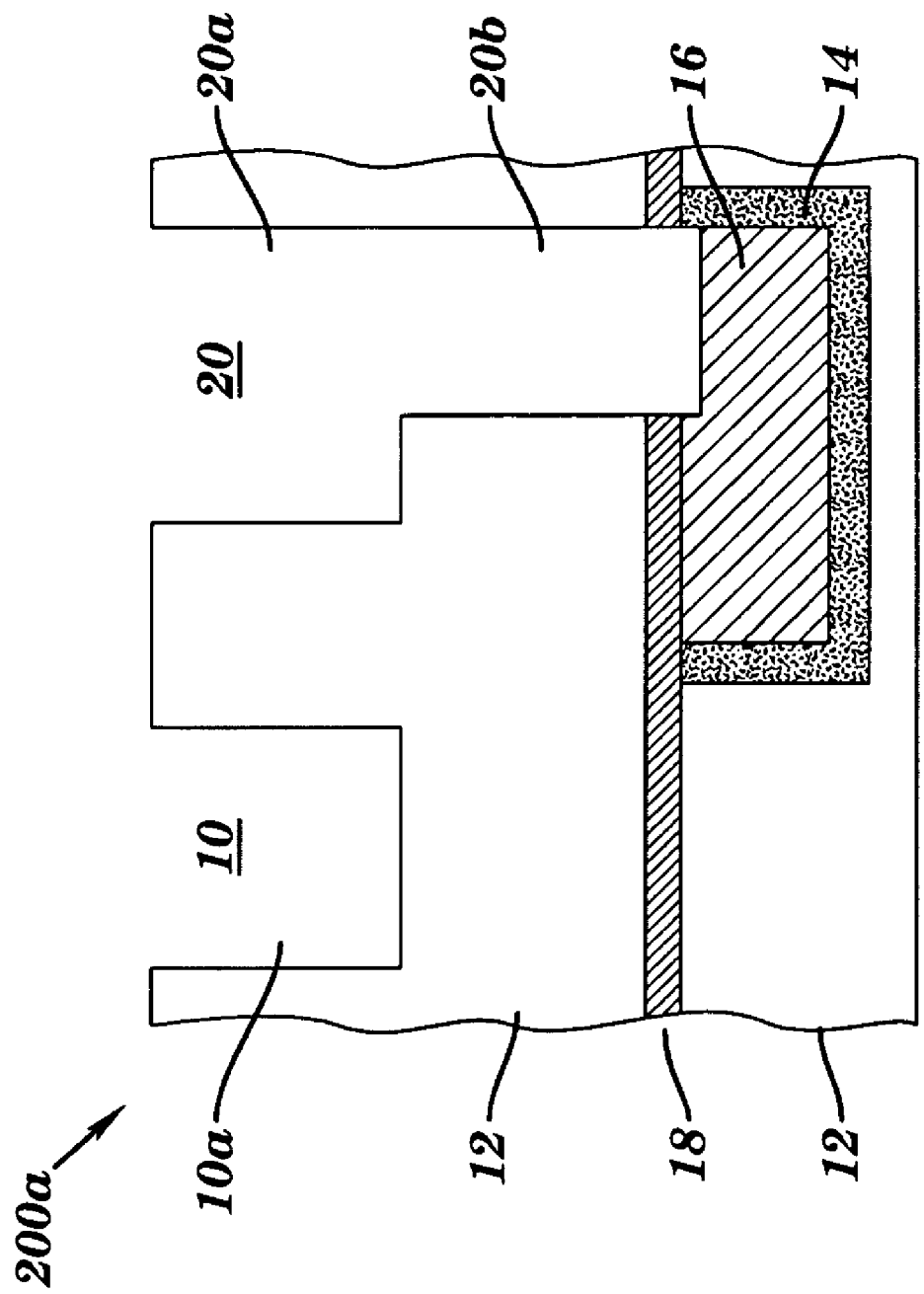

FIG. 2 depicts the first step of the method of the present invention. More specifically, FIG. 2 demonstrates the formation of a first opening 200a and second opening 200b (not shown until FIG. 4) in an insulating layer 12. Note that the openings 200a comprise both a single 10 and dual damascene 20 structure. As one of ordinary skill in the art would appreciate, the present invention is not limited to a first opening 200 comprising both a single 10 and dual damascene 20 structure, but instead could comprise either a single 10 or a dual damascene 20 structure. The single damascene 10 structure comprises a line 10a opening, while the dual damascene 20 structure comprised both a line 20a opening and a via 20b opening. The insulating layer 12 can be composed of SiO2, SiCOH, or SiLK. Note that the via 20b opening is connected to an underlying metal 16. The metal 16 typically comprises Cu or Al(Cu). A capping layer 18 separates the underlying metal 16 from the insulating layer 12 at the interface with the via 20b opening, and a barrier layer 14 separates the metal 16 from the insulating layer 12 in which the metal 16 is embedded. Typical materials for the capping layer 18 include NBloK, SiC, Si4NH3, and SiO2, while typical materials for the barrier layer 14 include Ta, Ti, TaN, TiN, WN, Ru, and W. After the first and second openings 200a,b are formed in the insulating layer 12, the next step of the method of the present invention occurs. Reactive ion etching techniques (RIE) create the first and second opening 200a,b.

Figure 3:
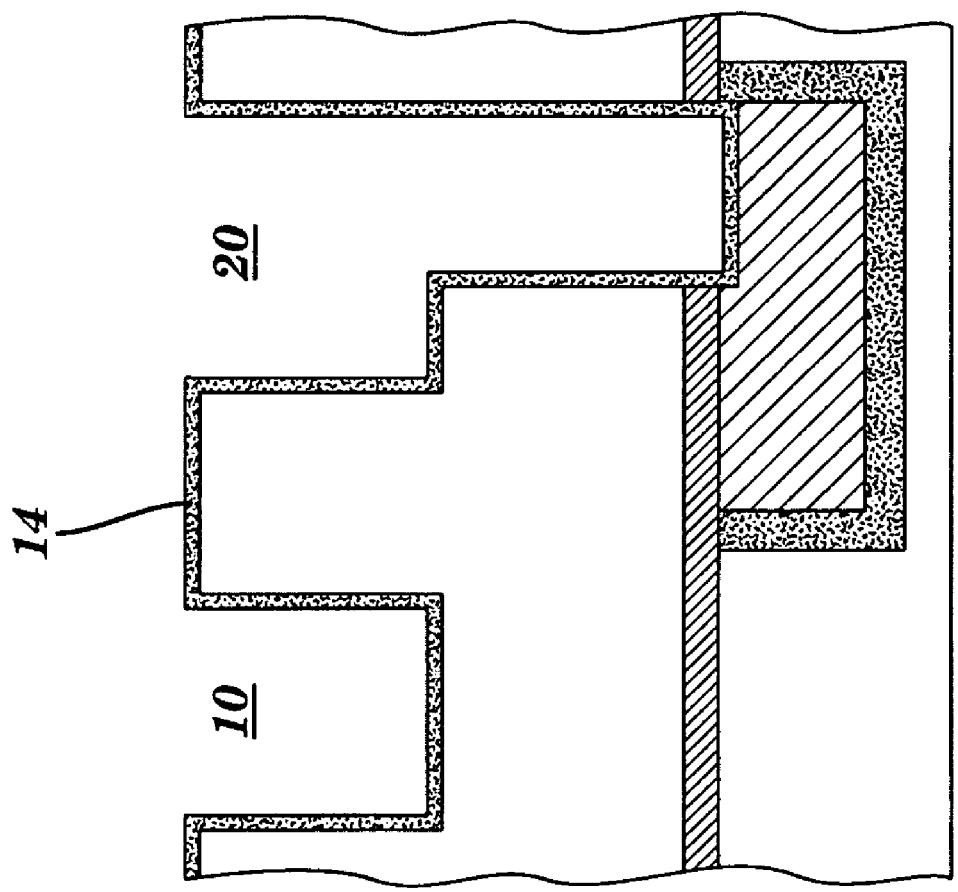

FIG. 3 depicts the second step of the method of the present invention. Once the first and second openings 200a,b are formed in the insulating layer 12, a barrier layer 14 is deposited on the sidewalls and bottom of the first and second openings 200a,b. As with the barrier layer 14 discussed with respect to FIG. 2, the barrier layer 14 deposited in the first and second opening 200a,b of FIG. 3 typically consists of Ta, Ti, TaN, TiN, WN, Ru, or W. The barrier layer 14 can be deposited through one of the following techniques, namely, Physical Vapor Deposition (PVD), Chemical Vapor Deposition (CVD), and Atomic Layer Deposition (ALD).

Figure 4:
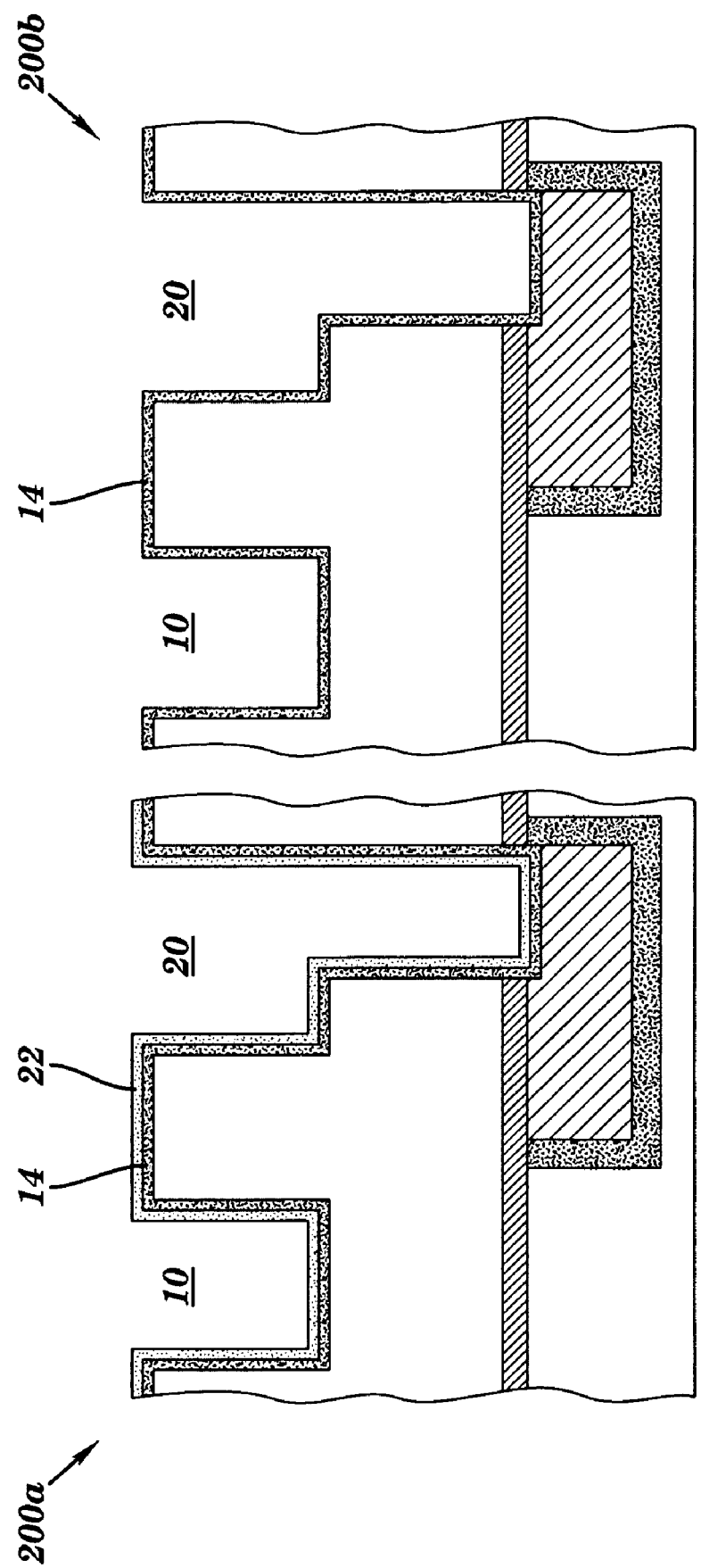

FIG. 4 depicts the third step of the method of the present invention. A copper grain promotion material 22 is deposited on top of the barrier layer 14 in 200a. A mask placed over the second opening 200b can be used to prevent the deposition of the copper grain promotion material 22 in the second opening 200b. The copper grain promotion material 22 consists of Ru, Ir, Rh, Mo, Re, Hf, Co, Pt, or Nb, and causes the grain size of any copper electroplated in the opening to be 20.0% larger than the average grain size of Cu electroplated in an opening without the copper grain promotion material 22. An even larger average grain size percentage increase, such as 50%, will further enhance a Cu interconnect for high performance applications. A 20% average grain size percentage increase, however is the minimum percentage increase that optimizes a Cu interconnect for high performance applications. The copper grain promotion material 22 can be deposited through PVD, CVD, or ALD.

Figure 5:
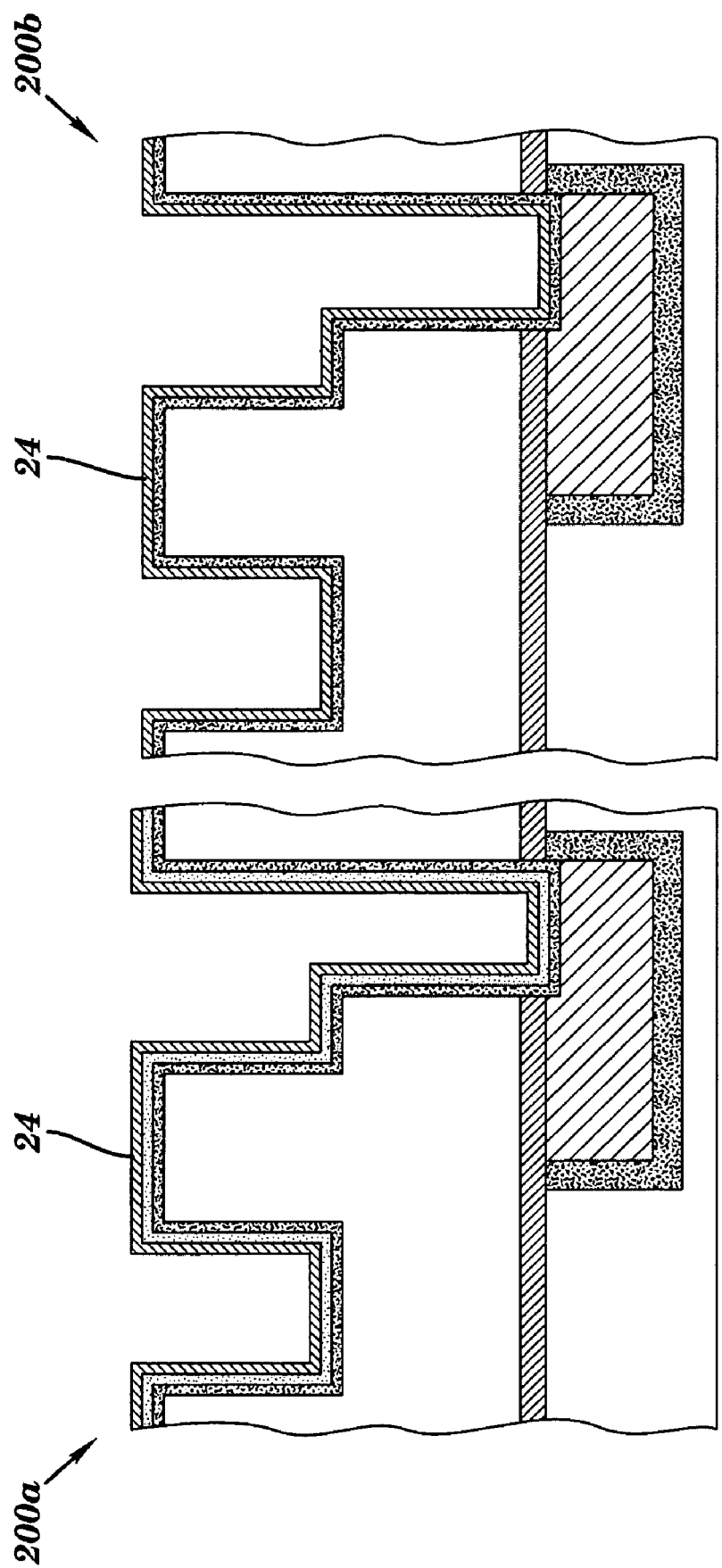

FIG. 5 depicts the fourth step of the method of the present invention. After the copper grain promotion material 22 has been deposited on top of the barrier layer 14 in 200a in FIG. 4, copper seed 24 is deposited on the copper grain promotion material 22 in the first opening 200a. The copper seed 24 can be deposited through PVD, CVD, or ALD. If a mask was used to prevent the deposition of the copper grain promotion material 22 in the second opening 200b in FIG. 4, the mask is removed from over the second opening 200b in FIG. 5, such that copper seed 24 can also be deposited on the copper grain promotion material 22 in FIG. 5. The copper seed 24 comprises either copper or a copper alloy. For perspective, it should be noted that the copper seed has a thickness of between 50 A and 500 A, while the copper grain promotion material has a thickness between 5 A and 80 A.

Figure 6:
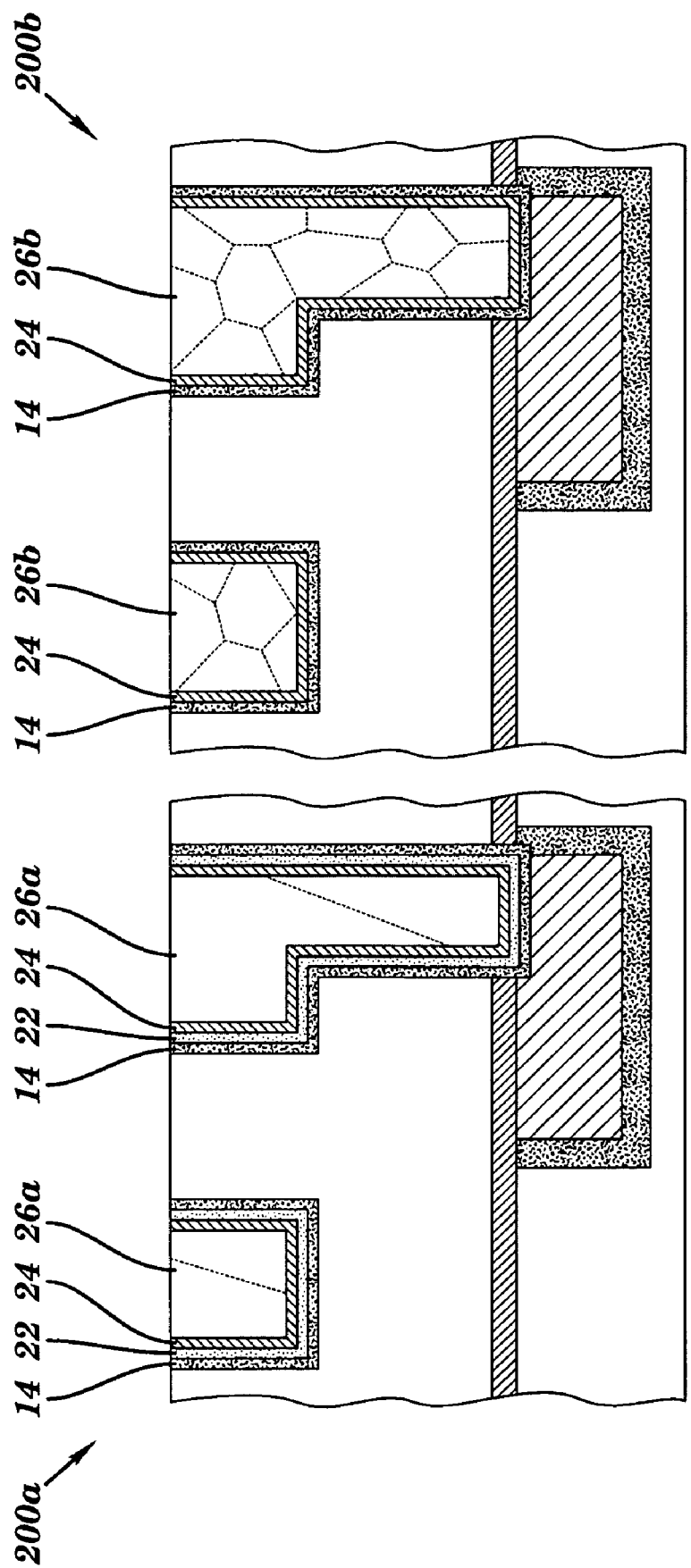

FIG. 6 depicts the final step of the method of the present invention and the structure of the present invention. Once the copper seed 24 has been deposited on the copper grain promotion material 22 in 200a and onto the barrier layer 14 in 200b, copper is electroplated in both the first 200a and second openings 200b. Note that the copper grain promotion material 22 caused the first opening 200a to have a grain size that is larger (e.g. closer to bamboo-type microstructure) than the grain size in the second opening that does not include a layer of copper grain promotion material 22. More specifically, the copper grain promotion material 22 caused the first opening 200a to have a copper grain size that is 20.0% larger than the grain size of the electroplated copper in the second opening 200b. The first 200a and second openings 200b are embedded in the same insulating level layer. Therefore, the present invention creates Cu interconnects with divergent copper grain sizes and as such, applications that require a Cu interconnect with a large copper grain size, e.g., copper interconnect, are created in the same insulating level layer as applications that require a Cu interconnect with a small copper grain size, e.g. fuses.

While the invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the invention.

What is claimed is:

1. A semiconductor structure, comprising:
a first and second opening within an insulating layer, said first and second opening within a same insulating layer;
a barrier material deposited on said insulating layer in said first and second opening;
a copper grain promotion material is deposited on said barrier material of said first opening;
a copper seed is deposited on said copper grain promotion material of said first opening and directly on said barrier material of said second opening;
copper is electroplated on said copper seed within said first and second openings; and,
wherein said copper grain promotion material increases grain size of said electroplated copper in said first opening, such that an average grain size of said electroplated copper grown in said first opening is larger than an average grain size of said electroplated copper in said second opening, said first and second opening within said same insulating level layer.

2. A semiconductor structure as in claim 1, further comprising:
wherein average copper grain size within said first opening with said grain promotion material is at least 20.0% larger than an average copper grain size within said second opening.

3. A semiconductor structure as in claim 1, said insulating layer is selected from the group consisting of SiO2, SiCOH, and SiLK.

4. A semiconductor structure as in claim 1, further comprising:
wherein said barrier material is selected from the group consisting of Ta, Ti, TaN, TiN, WN, Ru, and W.

5. A semiconductor structure as in claim 1, further comprising:
wherein said seed material is one of Cu and a Cu alloy.

6. A semiconductor structure as in claim 1, further comprising:
wherein said copper grain promotion material is selected from the group consisting of Ru, Ir, Rh, Mo, Re, Hf, Co, Pt, and Nb.

7. A semiconductor structure as in claim 1, further comprising:
wherein said copper seed is of a thickness of between 50 A and 500 A.

8. A semiconductor structure as in claim 1, further comprising:
wherein said copper grain promotion material is a thickness of between 5 A and 80 A.

* * * * *